United States Patent
Lee et al.

(10) Patent No.: US 7,550,353 B2
(45) Date of Patent: Jun. 23, 2009

(54) METHOD OF FORMING SEMICONDUCTOR DEVICE

(75) Inventors: Byung-Hak Lee, Gyeonggi-do (KR);
Woong-Hee Sohn, Seoul (KR);
Jae-Hwa Park, Gyeonggi-do (KR);
Gil-Heyun Choi, Seoul (KR);
Byung-Hee Kim, Seoul (KR); Hee-Sook Park, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 130 days.

(21) Appl. No.: 11/685,644

(22) Filed: Mar. 13, 2007

(65) Prior Publication Data

US 2008/0102615 A1 May 1, 2008

(30) Foreign Application Priority Data

Nov. 1, 2006 (KR) ............... 10-2006-0107339

(51) Int. Cl.
*H01L 21/8236* (2006.01)
(52) U.S. Cl. ............... 438/288; 438/201; 438/287; 438/769; 438/773; 438/775; 257/E21.18
(58) Field of Classification Search ............... 438/201, 438/287, 288, 769, 773, 775
See application file for complete search history.

(56) References Cited

U.S. PATENT DOCUMENTS 6,617,639 B1 * 9/2003 Wang et al. ............... 257/324

| | | | | |
|---|---|---|---|---|
| 6,627,494 B2 * | 9/2003 | Joo et al. | ............... | 438/240 |
| 2001/0025971 A1 * | 10/2001 | Powell | ............... | 257/288 |
| 2004/0121526 A1 * | 6/2004 | Yamamoto | ............... | 438/142 |
| 2005/0227437 A1 * | 10/2005 | Dong et al. | ............... | 438/265 |
| 2006/0054943 A1 * | 3/2006 | Li et al. | ............... | 257/266 |
| 2007/0048917 A1 * | 3/2007 | Yamamoto et al. | ............... | 438/197 |

FOREIGN PATENT DOCUMENTS

| KR | 2002-0049352 | 6/2002 |
|---|---|---|
| KR | 10-2002-0075000 | 10/2002 |
| KR | 2005-0003533 | 1/2005 |
| KR | 2006-0041553 | 5/2006 |
| KR | 10-2006-0075238 | 7/2006 |
| KR | 10-2006-0100092 | 9/2006 |
| KR | 10-2006-0109542 | 10/2006 |

OTHER PUBLICATIONS

English language abstract of Korean Publication No. 2005-0003533.
English language abstract of Korean Publication No. 2006-0041553.

* cited by examiner

*Primary Examiner*—George Fourson
*Assistant Examiner*—John M Parker
(74) *Attorney, Agent, or Firm*—Marger, Johnson & McCollom, P.C.

(57) ABSTRACT

One embodiment of a method for forming a semiconductor device can include forming a gate pattern on a semiconductor substrate and performing a selective re-oxidation process on the gate pattern in gas ambient including hydrogen, oxygen, and nitrogen. When the gate pattern includes a tunnel insulation layer, a metal nitride layer and a metal layer, the selective re-oxidation process heals the etching damage of a gate pattern and simultaneously prevents oxidation of the metal nitride layer and a tungsten electrode.

22 Claims, 4 Drawing Sheets

METHOD OF FORMING SEMICONDUCTOR DEVICE

CROSS-REFERENCE TO RELATED APPLICATIONS

This application claims benefit of foreign priority to Korean Patent Application No. 2006-107339, filed on Nov. 1, 2006, the entire contents of which are hereby incorporated by reference.

BACKGROUND

1. Field of Invention

Embodiments of the present invention relate generally to methods of forming semiconductor devices, and more particularly to a method of re-oxidizing a gate in a non-volatile memory device.

2. Discussion of the Related Art

Typically, after forming a gate pattern, a re-oxidation process is performed to heal etching damage created within the gate pattern. For example, a selective re-oxidation process is performed on a gate pattern formed of polysilicon and tungsten. The selective re-oxidation process may be performed in an ambient atmosphere containing $H_2O$ and $H_2$ in which only an etching damage of the polysilicon is oxidized due to an oxidative difference between tungsten and polysilicon.

However, in a charge trap flash (CTF) structure, a metal nitride layer such as TiN or TaN may be interposed between a tungsten layer and a charge storage layer. Since both TiN and TaN are oxidized in a re-oxidation process, gate characteristics of the charge trap flash (CTF) structure can become deteriorated.

FIG. 1 is a SEM picture illustrating a metal nitride layer that has been oxidized according to a related art re-oxidation process. During a related art re-oxidation process, TiN is oxidized to form $TiO_2$. Because TiN or TaN is oxidized in a re-oxidation process, a bridge can occur in the gate pattern or a threshold voltage scattering characteristic of the gate pattern can become deteriorated.

FIG. 2 is a SEM picture illustrating a surface of a metal nitride layer that has been oxidized according to a related art re-oxidation process. Due to oxidation of TiN, the surface morphology of TiN is very irregular. When the surface morphology of TiN is irregular, characteristics of the gate pattern can become deteriorated, thereby degrading the reliability of a charge trap flash structure incorporating the metal nitride layer as a gate material.

SUMMARY

Embodiments exemplarily described herein provide a method of forming a semiconductor device having improved reliability.

One exemplary embodiment can be characterized as a method of forming a semiconductor device that includes forming a gate pattern on a semiconductor substrate and performing a selective re-oxidation process on the gate pattern in gas ambient including hydrogen, oxygen, and nitrogen. The gate pattern can include a tunnel insulation layer, a metal nitride layer, and a metal layer.

In some embodiments, the metal nitride layer may include one of TaN and TiN and the metal layer may include tungsten.

In other embodiments, the gate pattern may include a tungsten nitride layer between the metal nitride layer and the metal layer.

In still other embodiments, the gas ambient may include $NH_3$.

In other embodiments, the gas ambient may include $H_2O$, $H_2$, and $NH_3$.

In even other embodiments, a partial-pressure ratio of $H_2O$ to $H_2$ ($H_2O/H_2$) may be about 0.01 to about 1.0 and a partial-pressure ratio of $NH_3$ to $H_2$ ($NH_3/H_2$) may be about 0.1 to about 10.

BRIEF DESCRIPTION OF THE DRAWINGS

The accompanying drawings are included to provide a further understanding of embodiments of the present invention, and are incorporated in and constitute a part of this specification. The drawings illustrate exemplary embodiments of the present invention and, together with the description, serve to explain principles of the present invention. In the figures.

DETAILED DESCRIPTION

Figure 1:
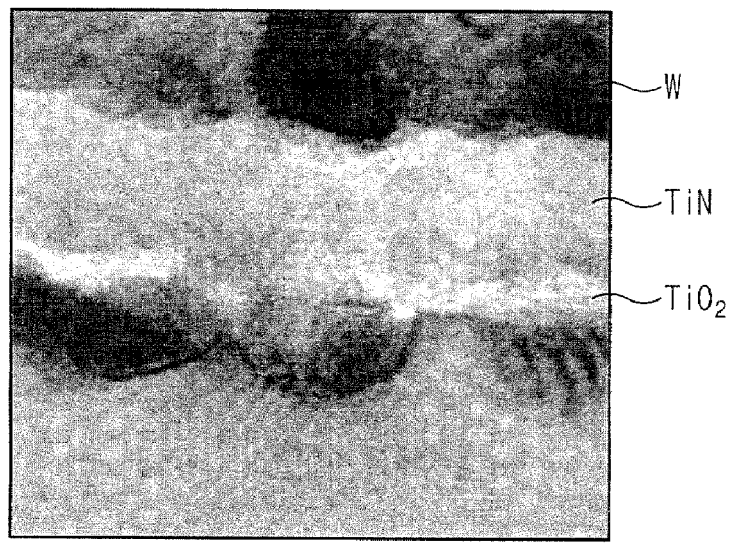
FIG. 1 is a SEM picture illustrating a metal nitride layer oxidized according to a related art re-oxidation process.

Exemplary embodiments of the present invention will be described below in more detail with reference to the accompanying drawings. Embodiments described herein may, however, be realized in different forms and should not be construed as limited to the embodiments set forth herein. Rather, these embodiments are provided so that this disclosure will be thorough and complete, and will fully convey the scope of the present invention to those skilled in the art.

In the figures, the dimensions of layers and regions are exaggerated for clarity of illustration. It will also be understood that when a layer (or film) is referred to as being 'on' another layer or substrate, it can be directly on the other layer or substrate, or intervening layers may also be present. Further, it will be understood that when a layer is referred to as being 'under' another layer, it can be directly under, and one or more intervening layers may also be present. In addition, it will also be understood that when a layer is referred to as being 'between' two layers, it can be the only layer between the two layers, or one or more intervening layers may also be present. Like reference numerals refer to like elements throughout.

Hereinafter, an exemplary embodiment of the present invention will be described in conjunction with the accompanying drawings.

Figure 3:
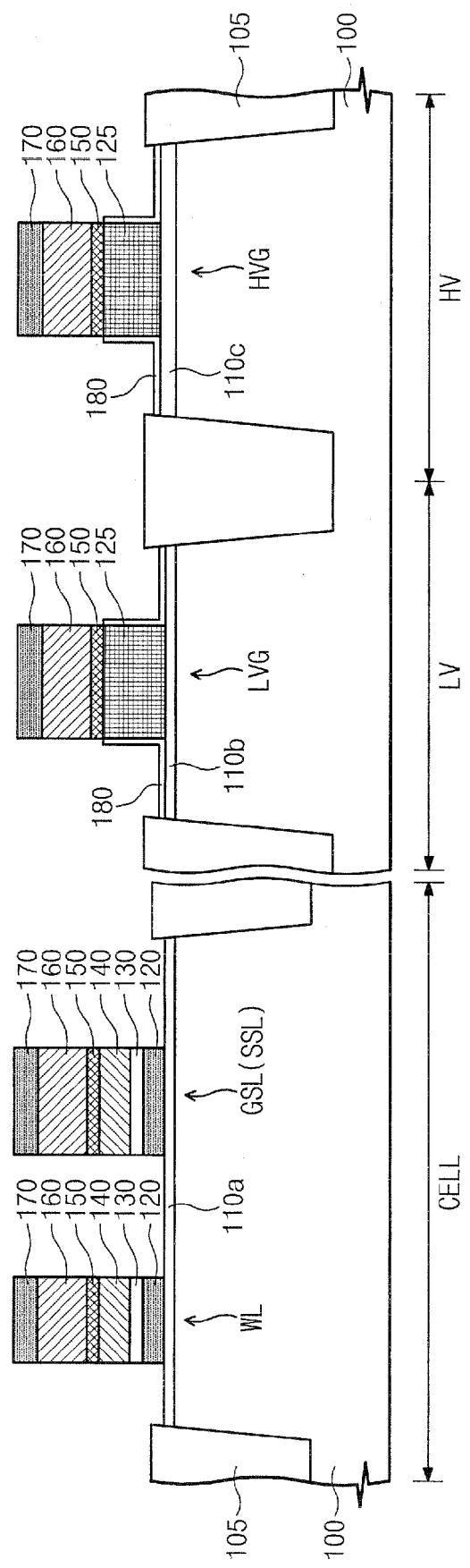
FIG. 3 is a sectional view of a semiconductor device according to an exemplary embodiment of the present invention.

FIG. 3 is a sectional view of a semiconductor device according to an exemplary embodiment of the present invention.

Referring to FIG. 3, a semiconductor substrate 100 includes a cell region CELL, a low voltage region LV, and a high voltage region HV. A device isolation layer 105 is provided to define an active region on the semiconductor substrate 100. A tunnel insulation layer 110a is provided on the active region of the cell region CELL. The tunnel insulation layer 110a may include a material such as silicon oxide. A first gate insulation layer 110b and a second gate insulation layer 110c are provided on the active regions of the low voltage region LV and the high voltage region HV, respectively. The second gate insulation layer 110c is used in a high voltage transistor and may be thicker than the first gate insulation layer 110b, which is used in a low voltage transistor.

A word line WL and a ground select line GSL (or a string select line SSL) are provided on the cell region CELL. In the illustrated embodiment, the word line WL and the ground select line GSL (or the string select line SSL) may include a charge storage layer 120, a blocking insulation layer 130, a metal nitride layer 140, a tungsten nitride layer 150, a metal layer 160 and a mask layer 170. The charge storage layer 120 is provided on the tunnel insulation layer 110a of the cell region CELL and may include a material such as silicon nitride. The blocking insulation layer 130 is provided on the charge storage layer 120 and 130 may include a material such as aluminum oxide ($Al_2O_3$). The metal nitride layer 140 is provided on the blocking insulation layer 130 and may include a material such as TiN or TaN. The tungsten nitride layer 150 may be provided on the metal nitride layer 140. The metal layer 160 is provided on the tungsten nitride layer 150 and may include a material such as tungsten. The mask layer 170 is provided on the metal layer 160 and may include a material such as silicon nitride or silicon oxide nitride.

A low voltage gate pattern LVG and a high voltage gate pattern HVG are provided on the low voltage region LV and the high voltage region HV, respectively. In the illustrated embodiment, both the low voltage gate pattern LVG and high voltage gate pattern HVG may include a poly silicon layer 125, the tungsten nitride layer 150, the metal layer 160 and the mask layer 170. The poly silicon layer 125 is provided on the first and second gate insulation layers 110b and 110c in the respective low voltage region LV and the high voltage region HV. The polysilicon layer 125 may include, for example, an N-type impurity. The tungsten nitride layer 150 may be provided on the polysilicon layer 125. The metal layer 160 may be provided on the tungsten nitride layer 150. The mask layer 170 may be provided on the metal layer 160. A re-oxidation layer 180 can also be provided on a sidewall of the polysilicon layer 125 by performing a selective re-oxidation process on the semiconductor substrate 100.

Figure 4:
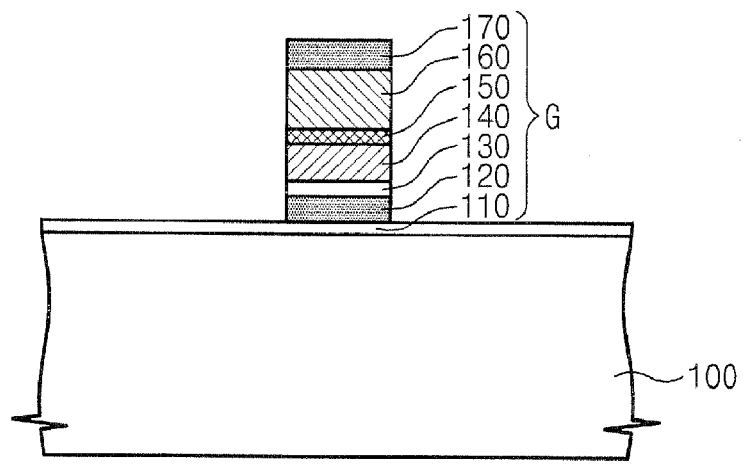
FIGS. 4 and 5 are sectional views illustrating a method of forming a semiconductor device according to an exemplary embodiment of the present invention.
Figure 5:
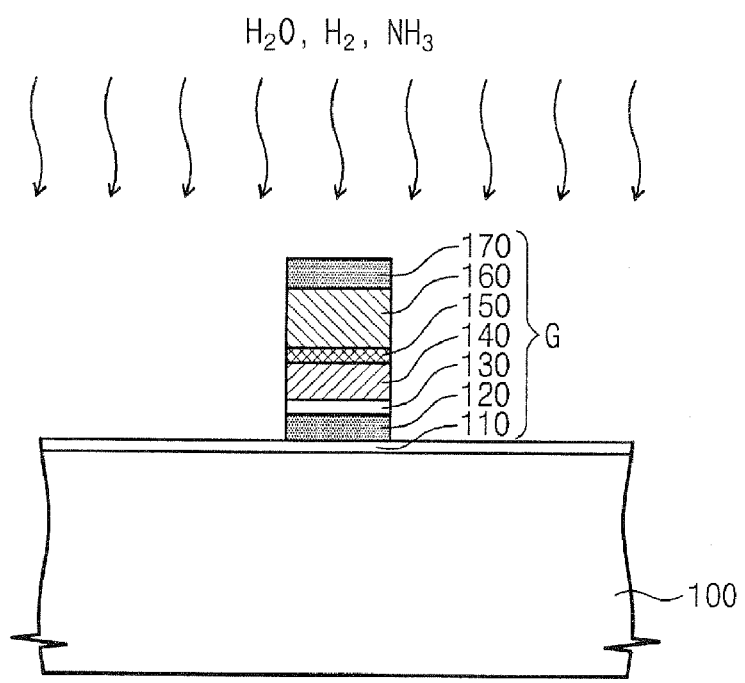

FIGS. 4 and 5 are sectional views illustrating a method of forming a semiconductor device according to an exemplary embodiment of the present invention.

Referring to FIG. 4, a gate pattern G, such as the aforementioned word line WL or ground select line GSL (or the string select line SSL), may include a tunnel insulation layer 110, a charge storage layer 120, a blocking insulation layer 130, a metal nitride layer 140, and a metal layer 160. The tunnel insulation layer 110 is formed on the semiconductor substrate 100 and can be formed, for example, according to a thermal oxidation process. The tunnel insulation layer 110 may be formed of other known high-k dielectric materials. The charge storage layer 120 is formed on the tunnel insulation layer 110 and may include a material such as silicon nitride. The blocking insulation layer 130 may be formed on the charge storage layer 120 and may include a material such as aluminum oxide. The metal nitride layer 140 may be formed on the blocking insulation layer 130 and may include a material such as TiN or TaN. The tungsten nitride layer 150 can be formed on the metal nitride layer 140. The metal layer 160 may be formed on the tungsten nitride layer 150 and may include a material such as tungsten. The mask layer 170 may be formed on the metal layer 160.

Referring to FIG. 5, the gate pattern G shown in FIG. 4 is subjected to a selective re-oxidation process. The selective re-oxidation process can be performed at a temperature within a range of about 700 to about 1000° C. The selective re-oxidation process can be performed in a gas ambient including, for example, hydrogen (e.g., $H_2$), oxygen (e.g., $H_2O$) and nitrogen (e.g., $NH_3$). A partial-pressure ratio of $H_2O$ to $H_2$ ($H_2O/H_2$) can be about 0.01 to about 1.0. A partial-pressure ratio of $NH_3$ to $H_2$ ($NH_3/H_2$) can be about 0.1 to about 10. The selective re-oxidation process heals an etching damage created within the gate pattern G as a result of an etching process used to form the gate pattern G and does not oxidize the metal nitride layer 140 and the tungsten nitride layer 150. $NH_3$ reduces and nitrides the metal nitride layer 140 and the tungsten nitride layer 150.

Figure 6:
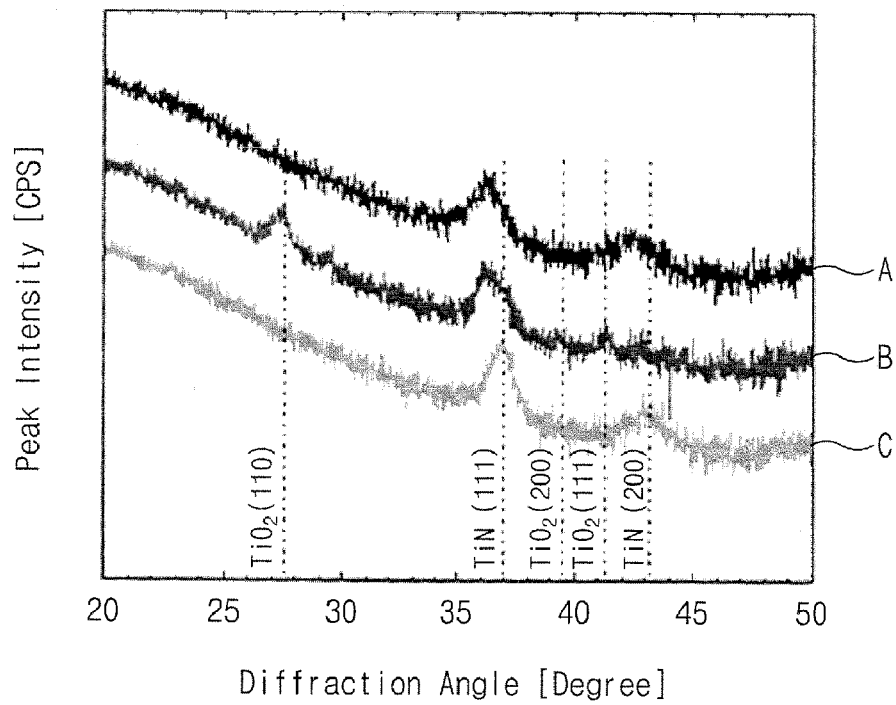
FIG. 6 is a graph illustrating the effects of a re-oxidation process according to an exemplary embodiment of the present invention.

FIG. 6 is a graph illustrating the effects of a re-oxidation process according to an exemplary embodiment of the present invention.

Referring to FIG. 6, the axis of abscissa represents the diffraction degree (2 theta) and the axis of ordinate represents a peak intensity of X-rays. In line A, TiN is deposited and a selective re-oxidation process is omitted. In line B, a related art selective re-oxidation process is performed on TiN. In line C, a selective re-oxidation process is performed on TiN according to an embodiment. Unlike the line A, the line B shows peak intensities in $TiO_2$ (110), $TiO_2$ (111), and $TiO_2$ (200). These peak intensities indicate that TiN has been oxidized. As shown with line C, however, a peak intensity does not exist for $TiO_2$, indicating that TiN has not been oxidized. The peak intensity change in TiN (111) is irrelevant to $TiO_2$.

Figure 7:
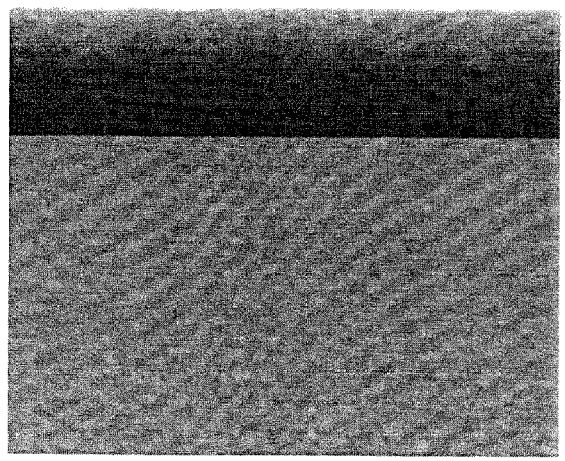
FIG. 7 is a SEM picture illustrating a surface of a metal nitride layer oxidized according to a re-oxidation process according to an exemplary embodiment of the present invention.

FIG. 7 is a SEM picture illustrating a surface of a metal nitride layer oxidized according to a re-oxidation process according to an exemplary embodiment of the present invention.

Figure 2:
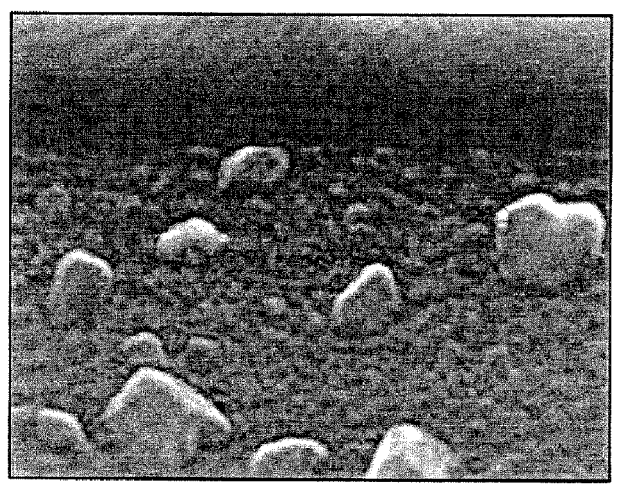
FIG. 2 is a SEM picture illustrating a surface of a metal nitride layer oxidized according to a related art re-oxidation process.

As shown in FIG. 7, oxidation of TiN is suppressed as compared with the TiN shown in FIG. 2. Accordingly, the surface state of the TiN shown in FIG. 7 is improved over the surface state of the TiN shown in FIG. 2. Moreover, the surface status of the metal nitride layer is enhanced, thereby improving a threshold voltage scattering characteristic and reliability in a charge trap flash (CTF) device.

As described above, a selective re-oxidation process is performed in an ambient atmosphere including ammonia gas. Accordingly, the etching damage of a gate pattern is healed and simultaneously oxidation of a metal nitride layer and a tungsten electrode can be prevented.

The above-disclosed subject matter is to be considered illustrative, and not restrictive, and the appended claims are intended to cover all such modifications, enhancements, and other embodiments, which fall within the true spirit and scope of the present invention as recited in the claims. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method of forming a semiconductor device, the method comprising:
   forming a gate pattern on a semiconductor substrate, the gate pattern including a tunnel insulation layer, a metal nitride layer and a metal layer; and performing a selective re-oxidation process on the gate pattern in a gas ambient comprising hydrogen, oxygen, and nitrogen, wherein the gate pattern comprises a charge storage layer and a blocking insulation layer between the tunnel insulation layer and the metal nitride layer.

2. The method of claim 1, wherein the charge storage layer comprises silicon nitride and wherein the blocking insulation layer comprises aluminum oxide.

3. The method of claim 1, wherein the metal nitride layer comprises one of TaN and TiN.

4. The method of claim 1, wherein the metal layer comprises tungsten.

5. The method of claim 1, wherein the selective re-oxidation process is performed at a temperature in a range between about 700° C. and about 1000° C.

6. The method of claim 1, wherein the nitrogen component of the gas ambient comprises $NH_3$.

7. The method of claim 1, wherein the gas ambient comprises $H_2O$, $H_2$, and $NH_3$.

8. The method of claim 7, wherein a partial-pressure ratio of $H_2O$ to $H_2$ is about 0.01 to about 1.0.

9. The method of claim 7, wherein a partial-pressure ratio of $NH_3$ to $H_2$ is about 0.1 to about 10.

10. The method of claim 1, wherein the gate pattern comprises a tungsten nitride layer between the metal nitride layer and the metal layer.

11. A method of forming a semiconductor device, the method comprising:

forming a first gate pattern in a first region of a substrate, the first gate pattern including a tunnel insulation layer, a charge storage layer, a metal layer and a metal nitride layer interposed between the charge storage layer and the metal layer;

forming a second gate pattern in a region outside the first region of the substrate, the second gate pattern including a polysilicon layer;

subjecting the first and second gate patterns to a re-oxidation process in a gas ambient comprising hydrogen, oxygen, and nitrogen, thereby forming a re-oxidation layer on a sidewall of the polysilicon layer, wherein the charge storage layer comprises a different material from the polysilicon layer.

12. The method of claim 11, wherein the metal nitride layer comprises one of TaN and TiN.

13. The method of claim 11, wherein the metal layer comprises tungsten.

14. The method of claim 11, wherein the gate pattern comprises a tungsten nitride layer between the metal nitride layer and the metal layer.

15. The method of claim 11, wherein the selective re-oxidation process is performed at a temperature in a range between about 700° C. and about 1000° C.

16. The method of claim 11, wherein the nitrogen component of the gas ambient comprises $NH_3$.

17. The method of claim 11, wherein the gas ambient comprises $H_2O$, $H_2$, and $NH_3$.

18. The method of claim 17, wherein a partial-pressure ratio of $H_2O$ to $H_2$ is about 0.01 to about 1.0.

19. The method of claim 17, wherein a partial-pressure ratio of $NH_3$ to $H_2$ is about 0.1 to about 10.

20. The method of claim 11, wherein the charge storage layer comprises silicon nitride.

21. The method of claim 11, further comprising a blocking insulation layer interposed between the charge storage layer and the metal nitride layer.

22. A method of forming a semiconductor device, the method comprising:

forming a gate pattern on a semiconductor substrate, the gate pattern including a tunnel insulation layer, a metal nitride layer and a metal layer; and performing a selective re-oxidation process on the sate pattern in a gas ambient comprising hydrogen, oxygen, and nitrogen, wherein the gate pattern comprises a tungsten nitride layer between the metal nitride layer and the metal layer.

* * * * *

UNITED STATES PATENT AND TRADEMARK OFFICE
CERTIFICATE OF CORRECTION

PATENT NO. : 7,550,353 B2  Page 1 of 1
APPLICATION NO. : 11/685644
DATED : June 23, 2009
INVENTOR(S) : Byung-Hak Lee et al.

It is certified that error appears in the above-identified patent and that said Letters Patent is hereby corrected as shown below:

Column 6, line 33, the word "sate" should read -- gate --.

Signed and Sealed this

Twenty-second Day of September, 2009

David J. Kappos
*Director of the United States Patent and Trademark Office*